United States Patent
DeMuynck et al.

(10) Patent No.: US 9,390,969 B2
(45) Date of Patent: Jul. 12, 2016

(54) INTEGRATED CIRCUIT AND INTERCONNECT, AND METHOD OF FABRICATING SAME

(71) Applicant: GLOBALFOUNDRIES INC., Grand Cayman (KY)

(72) Inventors: David A. DeMuynck, Underhill, VT (US); Zhong-Xiang He, Essex Junction, VT (US); Daniel R. Miga, St. Albans, VT (US); Matthew D. Moon, Jeffersonville, VT (US); Daniel S. Vanslette, Fairfax, VT (US); Eric J. White, Charlotte, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/600,273

(22) Filed: Jan. 20, 2015

(65) Prior Publication Data
US 2015/0140809 A1    May 21, 2015

Related U.S. Application Data

(62) Division of application No. 12/898,885, filed on Oct. 6, 2010, now abandoned.

(51) Int. Cl.
*H01L 21/4763* (2006.01)
*H01L 21/768* (2006.01)
(Continued)

(52) U.S. Cl.
CPC .... *H01L 21/76843* (2013.01); *H01L 21/76802* (2013.01); *H01L 21/76834* (2013.01);
(Continued)

(58) Field of Classification Search
CPC .......... H01L 2924/0002; H01L 2924/00; H01L 21/76802; H01L 21/76834; H01L 21/76843; H01L 21/76846; H01L 21/76879; H01L 23/5227; H01L 28/10
USPC .......... 257/531, 751, 761, 758, 763, 774; 438/3, 676, 641, 633, 627, 539
See application file for complete search history.

(56) References Cited

U.S. PATENT DOCUMENTS 5,098,860 A * 3/1992 Chakravorty ......... H01L 21/288 205/118
5,541,135 A   7/1996 Pfeifer et al.
(Continued)

FOREIGN PATENT DOCUMENTS

CN   101814475 A   8/2010
KR   20000011105 A   2/2000
(Continued)

OTHER PUBLICATIONS

Patent Cooperation Treaty, International Search Report for PCT/US2011/051348 dated Apr. 9, 2012, 3 pages.
(Continued)

*Primary Examiner* — Mohammed Shamsuzzaman
(74) *Attorney, Agent, or Firm* — Anthony Canale; Hoffman Warnick LLC

(57) ABSTRACT

The disclosure relates generally to integrated circuits (IC), IC interconnects, and methods of fabricating the same, and more particularly, high performance inductors. The IC includes at least one trench within a dielectric layer disposed on a substrate. The trench is conformally coated with a liner and seed layer, and includes an interconnect within. The interconnect includes a hard mask on the sidewalls of the interconnect.

18 Claims, 6 Drawing Sheets

(51) Int. Cl.
  *H01L 23/522* (2006.01)
  *H01L 49/02* (2006.01)

(52) U.S. Cl.
  CPC .... *H01L21/76846* (2013.01); *H01L 21/76879* (2013.01); *H01L 23/5227* (2013.01); *H01L 28/10* (2013.01); *H01L 2924/0002* (2013.01)

(56) References Cited

U.S. PATENT DOCUMENTS

| | | | |
|---|---|---|---|
| 5,788,854 A | 8/1998 | Desaigoudar et al. | |
| 6,127,052 A * | 10/2000 | Tomari | H05K 3/181 205/126 |
| 6,210,781 B1 | 4/2001 | Baum et al. | |
| 6,368,484 B1 | 4/2002 | Volant et al. | |
| 6,379,871 B1 | 4/2002 | Suzuki | |
| 6,429,118 B1 * | 8/2002 | Chen | H01L 21/2855 257/E21.169 |
| 6,472,721 B2 * | 10/2002 | Ma | H01L 28/60 257/531 |
| 6,699,396 B1 * | 3/2004 | Drewery | C25D 5/022 216/40 |
| 6,841,466 B1 | 1/2005 | Yu et al. | |
| 6,890,829 B2 | 5/2005 | Cheng et al. | |
| 7,029,925 B2 * | 4/2006 | Celii | H01L 21/31122 257/E21.009 |
| 7,068,138 B2 | 6/2006 | Edelstein et al. | |
| 7,109,112 B2 | 9/2006 | Chopra et al. | |
| 7,189,638 B2 * | 3/2007 | Shim | H01L 21/76879 257/E21.586 |
| 7,223,654 B2 * | 5/2007 | Yang | H01L 23/5223 257/E21.008 |
| 7,259,640 B2 | 8/2007 | Brown et al. | |
| 7,456,030 B1 | 11/2008 | Hopper | |
| 7,601,627 B2 * | 10/2009 | Cabral, Jr. | H01L 21/76801 257/E23.021 |
| 7,875,977 B2 * | 1/2011 | Barth | H01L 21/76843 257/751 |
| 2002/0030274 A1 * | 3/2002 | Chopra | H01L 21/2885 257/751 |
| 2004/0113235 A1 * | 6/2004 | Coolbaugh | H01L 21/76807 257/532 |
| 2004/0219778 A1 | 11/2004 | Shim et al. | |
| 2006/0027932 A1 * | 2/2006 | Yu | H01L 21/76846 257/763 |
| 2006/0202345 A1 * | 9/2006 | Barth | H01L 21/76843 257/761 |
| 2006/0270228 A1 | 11/2006 | Lee et al. | |
| 2007/0087567 A1 * | 4/2007 | Lee | H01L 21/2855 438/687 |
| 2008/0042283 A1 * | 2/2008 | Purushothaman | H01L 21/76825 257/754 |
| 2008/0102409 A1 | 5/2008 | Lee et al. | |
| 2008/0164584 A1 * | 7/2008 | Cabral | H01L 21/76801 257/660 |
| 2009/0061568 A1 * | 3/2009 | Bangsaruntip | B82Y 10/00 438/151 |
| 2009/0166867 A1 * | 7/2009 | Simka | H01L 21/76831 257/751 |
| 2009/0200640 A1 * | 8/2009 | Hosoi | H01L 27/101 257/536 |
| 2009/0280649 A1 * | 11/2009 | Mayer | B23H 5/08 438/676 |
| 2010/0193954 A1 * | 8/2010 | Liu | H01L 21/76898 257/751 |
| 2011/0256715 A1 * | 10/2011 | Pan | H01L 21/76831 438/653 |
| 2014/0027912 A1 * | 1/2014 | Farooq | H05K 3/423 257/751 |

FOREIGN PATENT DOCUMENTS

| | | |
|---|---|---|
| KR | 20000056387 A | 9/2000 |
| KR | 20050011105 A | 1/2005 |
| KR | 20050056387 A | 6/2005 |

OTHER PUBLICATIONS

Great Britain Application No. GB1307079.2, Examination Report dated Jan. 20, 2014, 3 pages.
Shamsuzzaman, Office Action Communication for U.S. Appl. No. 12/898,885 dated Oct. 16, 2012, 8 pages.
Shamsuzzaman, Office Action Communication for U.S. Appl. No. 12/898,885 dated May 23, 2013, 12 pages.
Shamsuzzaman, Office Action Communication for U.S. Appl. No. 12/898,885 dated Oct. 21, 2014, 16 pages.
Shamsuzzaman, Office Action Communication for U.S. Appl. No. 12/898,885 dated Jun. 1, 2012, 16 pages.
Shamsuzzaman, Office Action Communication for U.S. Appl. No. 12/898,885 dated Jan. 17, 2013, 16 pages.
Shamsuzzaman, Office Action Communication for U.S. Appl. No. 12/898,885, dated Mar. 20, 2014, 13 pages.
Shamsuzzaman, Office Action Communication for U.S. Appl. No. 12/898,885 dated Jul. 31, 2014, 19 pages.
Chinese Patent Office, Office Action for Application No. CN103155107 dated Jan. 7, 2015, 7 pages.

* cited by examiner

INTEGRATED CIRCUIT AND INTERCONNECT, AND METHOD OF FABRICATING SAME

CROSS-REFERENCE TO RELATED APPLICATIONS

This application is a divisional of currently pending U.S. patent application Ser. No. 12/898,885 filed on Oct. 6, 2010. The application identified above is incorporated herein by reference in its entirety for all that it contains in order to provide continuity of disclosure.

TECHNICAL FIELD

The disclosure relates generally to integrated circuits and methods of fabricating the same, and more particularly, to integrated circuits having interconnects such as high performance inductors.

BACKGROUND

Integrated circuit interconnects, and particularly, high performance inductors are used for most types of radio frequency circuits and are typically fabricated having thick metal wires such as copper or aluminum. Traditionally, the metal wires are formed using electrolytic plating processes in conjunction with photoresist masking and stripping, and removing a seed layer later on.

SUMMARY

An aspect of the present invention relates to an integrated circuit comprising: at least one trench within a dielectric layer disposed on a substrate, the trench conformally coated with a liner and seed layer; and an interconnect within the trench, the interconnect including a hard mask on sidewalls of the interconnect.

A second aspect of the present invention relates to a method of fabricating an interconnect in an integrated circuit, the method comprising: conformally coating a trench with a liner and seed layer, the trench being within a dielectric layer disposed on a substrate; depositing a hard mask on the liner and seed layer; masking and patterning the trench to expose the hard mask; removing exposed areas of the hard mask to expose areas of the liner and seed layer; electrolytic metal plating the exposed areas of the liner and seed layer to form an interconnect; and planarizing the interconnect with a top surface of the trench.

A third aspect of the present invention relates to an inductor comprising: a core conductor including a top surface, a bottom surface, and sidewalls within a trench, the trench being within a dielectric layer on a substrate, and having a liner and seed layer on a bottom and sidewalls of the trench; and a hard mask on the sidewalls of the core conductor.

A fourth aspect of the present invention relates to a method of fabricating an inductor, the method comprising: conformally coating a trench with a liner and seed layer, the trench being within a dielectric layer on a substrate; depositing a hard mask on the liner and seed layer; masking and patterning the trench to expose the hard mask; removing exposed areas of the hard mask to expose areas of the liner and seed layer; electrolytic metal plating the exposed areas of the liner and seed layer to form a core conductor; and planarizing the core conductor, the hard mask, the liner and seed layer with a top surface of the trench.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In order to achieve high performance (high quality factor) integrated circuits (IC) and IC interconnects employing thick copper wires, and in particular, copper inductors, fabrication techniques such as through-plating are commonly used. It has been discovered that image size tolerance and overlay associated with through-plating techniques are not adequate for fabrication of high performance interconnects such as inductors. Alternatively, selective plating fabrication techniques have been used to form interconnects. However, copper seed layer corrosion can occur during chemical-mechanical polishing of the layer and cross-wafer plating uniformity associated with selective plating fabrication remains a concern using selective plating fabrication techniques.

Figure 1:
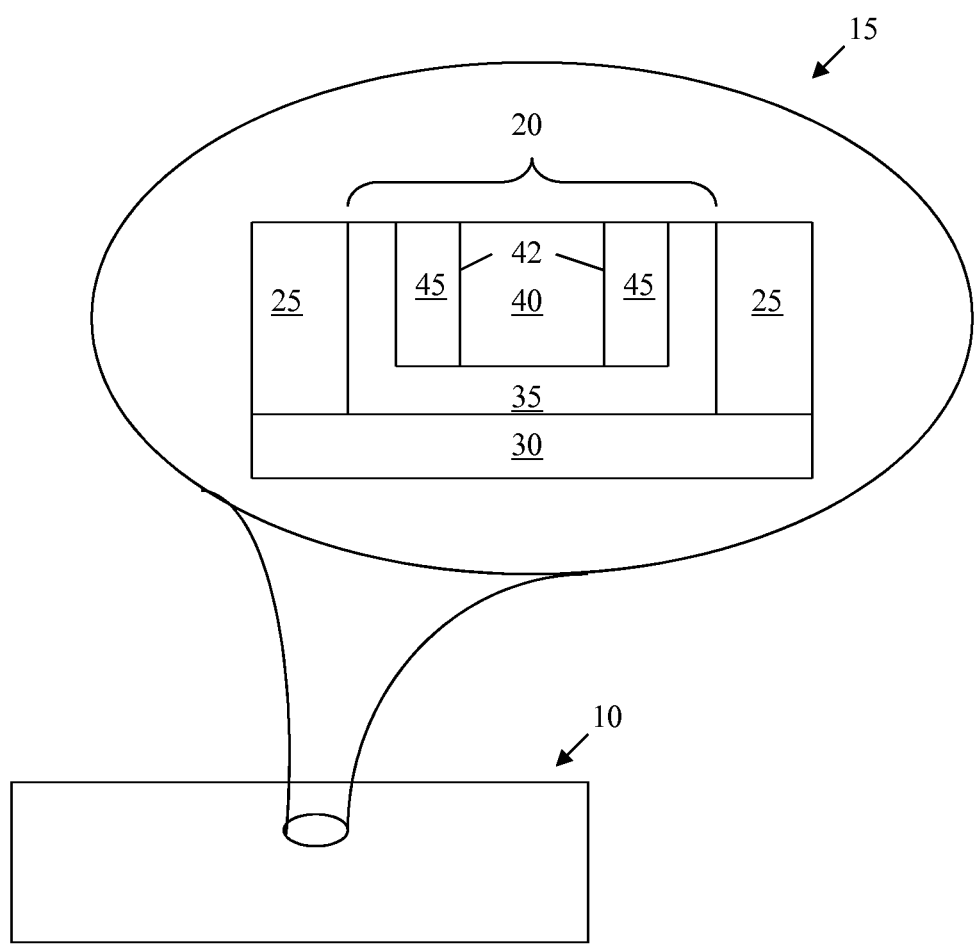
FIG. 1 depicts an embodiment of an integrated circuit including at least one interconnect, in accordance with the present invention.

An embodiment of an integrated circuit (IC) including at least one interconnect is presented in FIG. 1, in accordance with the present invention. Referring to FIG. 1, an IC 10 is shown. IC 10 represents a miniaturized electronic circuit constructed of individual semiconductor devices, as well as passive components, etc. bonded to a substrate or circuit board. IC 10 may represent any conventional IC known in the art and may comprise any conventional IC components known in the art. A blow up 15 represents an expanded, cross-sectional view of a selected area 17 of IC 10 so that selected area 17 may be seen and described more clearly. Blow up 15 shows a trench 20, a dielectric layer 25, a substrate 30, a liner and seed layer 35, an interconnect 40, and a hard mask 45 of IC 10. Trench 20 is within dielectric layer 25 wherein dielectric layer 25 is disposed on substrate 30. Trench 20 may be approximately 5 microns (μm) to approximately 150 μm wide and approximately 5 μm to approximately 20 μm deep.

Substrate 30 is a semiconductor substrate that may comprise but is not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Semiconductor substrate 30 may also comprise Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Dielectric layer 25 may be approximately 5 μm to approximately 20 μm thick. Dielectric layer 25 may be a material such as but not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ), methyl silsesquioxane polymer (MSQ), SiLK™ (polyphenylene oligomer) manufactured by Dow Chemical, Midland, Mich.; Black Diamond™ [$SiO_x(CH_3)_y$] manufactured by Applied Materials, Santa Clara, Calif.; fluorinated tetraethylorthosilicate (FTEOS), and fluorinated silicon glass (FSG). In an embodiment, dielectric layer 25 may comprise FSG or an organic material, for example, a polyimide.

Dielectric layer 25 may also comprise multiple dielectric layers, for example, a first low-k (dielectric constant) layer and a second dielectric layer such as $Si_3N_4$ or $SiO_2$. The second dielectric layer may have a higher k dielectric constant value than the first low-k dielectric layer. Low-k dielectric layers include materials having a relative permittivity value of 4 or less, examples of which include but are not limited to HSQ, MSQ, SiLK™, Black Diamond™, FTEOS, and FSG.

Trench 20 may include a conformal coating of liner and seed layer 35. Liner and seed layer 35 may be approximately 500 Å to approximately 3,000 Å thick. The liner component of layer 35 may comprise tantalum (Ta), tantalum nitride (TaN), tantalum-aluminum nitride (TaAlN), tantalum silicide ($TaSi_2$), titanium (Ti), titanium nitride (TiN), titanium-silicon nitride (TiSiN), or tungsten (W). The liner component may be a layer approximately 100 Å to approximately 500 Å thick. The seed component of layer 35 may be, for example, a copper seed layer disposed on the liner layer and may be approximately 400 Å to approximately 2,000 Å thick. In an embodiment, the liner component of layer 35 is in contact with trench 20 and substrate 30, and the seed component overlays the liner component.

Interconnect 40 is located within trench 20 and may include a hard mask 45 on sidewalls 42 of interconnect 40. Interconnect 40 may comprise copper, silver, and/or gold, and for example, may be used as an inductor or a transmission line. Interconnect 40 may be approximately 5 μm to approximately 150 μm wide. Hard mask 45 may be an anti-seeding conductive material or a dielectric material. The anti-seeding conductive material may be selected from the group consisting of TiN, Ta, and TaN. The dielectric material may be selected from the group consisting of silicon nitride ($Si_3N_4$), silicon carbide (SiC), and aluminum oxide ($Al_2O_3$).

Figure 2A:
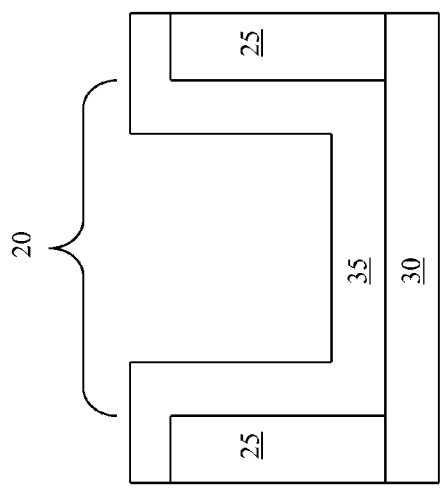
FIGS. 2A-2H depicts steps of an embodiment of a method for fabricating an interconnect in an integrated circuit, in accordance with the present invention.

An embodiment of steps of a method for fabricating an interconnect in an integrated circuit are shown in FIGS. 2A-2H. Referring to FIG. 2A, a substrate 30 comprising silicon, silicon-on-insulator, silicon germanium, or gallium arsenide is provided. Substrate 30 may include any construction comprising semiconductor material, including but not limited to bulk semi-conductive materials such as a semiconductor wafer (either alone or in assemblies comprising other materials thereon, for example, an integrated circuit).

Substrate 30 may already have a dielectric layer 25 deposited thereon. Dielectric layer 25 may include silicon oxide, FSG, or an organic material, for example, polyimide. Alternatively, dielectric layer 25 may be deposited on substrate 30 using any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD).

A trench 20 is etched into dielectric layer 25. This may be accomplished by applying a layer of photoresist on dielectric layer 25, performing a photolithographic process, and performing a reactive ion etch (RIE) process selective to etch, for example, silicon oxide, to define trench 20 in dielectric layer 25.

Figure 2B:
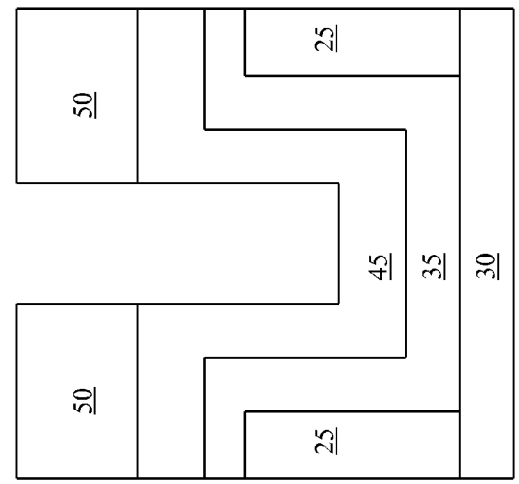

Referring to FIG. 2B, trench 20 is conformally coated with a liner and seed layer 35. The liner component of layer 35 deposited may be Ta and may be approximately 100 Å to approximately 1,000 Å thick. The seed component of layer 35 may be copper and may be approximately 400 Å to approximately 2,000 Å thick. The aforementioned may be formed by, for example, PVD. Liner and seed layer 35 may conformally coat the bottom and side walls of trench 20, and a top surface of dielectric layer 25.

Figure 2C:
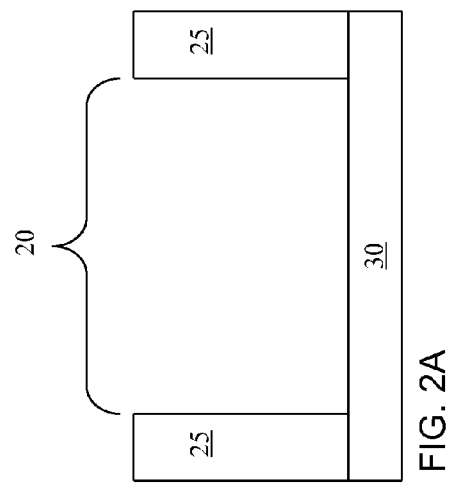

Referring to FIG. 2C, a hard mask 45 may be deposited on liner and seed layer 35 via conventional CVD or PVD processes known in the art. Alternatively, hard mask 45 may be deposited using any now known or later developed techniques appropriate for the material to be deposited including but not limited to, for example: low-pressure CVD (LPCVD), plasma-enhanced CVD (PECVD), ultra-high vacuum CVD (UHVCVD), limited reaction processing CVD (LRPCVD), metalorganic CVD (MOCVD), sputtering deposition, ion beam deposition, electron beam deposition, laser assisted deposition, and atomic layer deposition (ALD). Hard mask 45 may comprise TiN and may be approximately 300 Å to approximately 1,000 Å thick throughout the entire layer. In an embodiment, hard mask 45 may be approximately 400 Å thick.

Figure 2D:
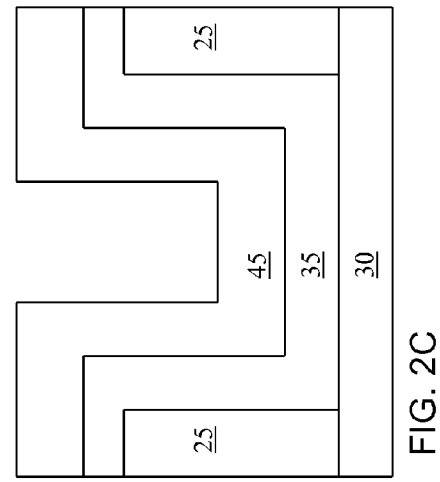

Referring to FIG. 2D, trench 20 may be masked with a photoresist layer 50 and may be patterned to expose the area of hard mask 45 that coats the bottom of trench 20. Photoresist layer 50 may be approximately 8 μm to approximately 50 μm thick. In one embodiment, photoresist layer 50 may be approximately 10 μm. Photoresist materials used for masking and patterning, and methods of performing the same are known in the art.

Figure 2E:
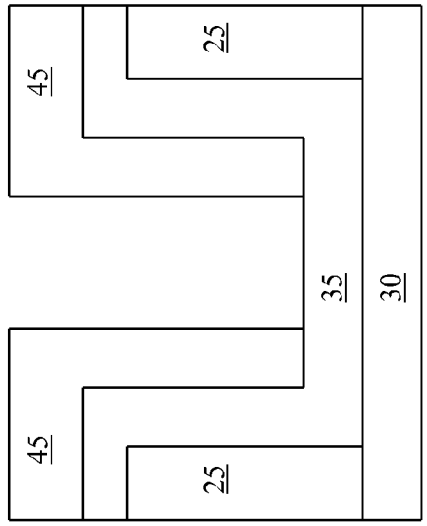

Referring to FIG. 2E, a reactive ion etch (RIE) may then be performed to partially etch the area of hard mask 45 that coats the bottom of trench 20. The thickness of the area partially etched may be reduced from approximately 400 Å to approximately 100 Å. Photoresist layer 50 may then be subsequently stripped.

Figure 2F:
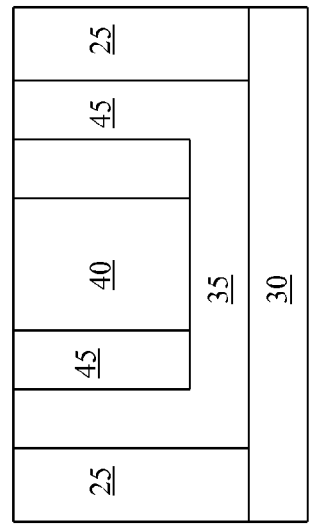

Referring to FIG. 2F, a blanket RIE may be performed etching the remaining area of hard mask 45 that coats the bottom of trench 20 and the areas of hard mask 45 coating liner and seed layer 35 on dielectric layer 25. The remaining area of hard mask 45 may be etched away exposing the copper seed component of layer 35, and the areas coating liner and seed layer 35 may be etched to approximately 300 Å.

Figure 2G:
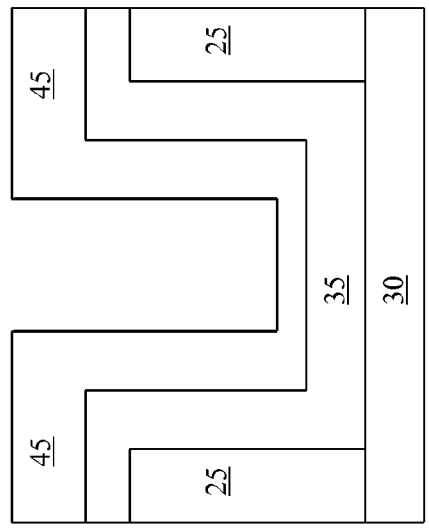

Referring to FIG. 2G, interconnect 40 may be formed from liner and seed layer 35 by performing an electrolytic metal plating process to fill trench 20. The process may be performed with a current density of approximately 1 $A/cm^2$ to approximately 20 $A/cm^2$ using a plating solution including a copper sulfate solution, a sulfuric acid solution, and a solution including chlorine ions. Interconnect 40 is vertically grown from the exposed areas of the copper seed component of layer 35 toward and past the top of trench 20.

Figure 2H:
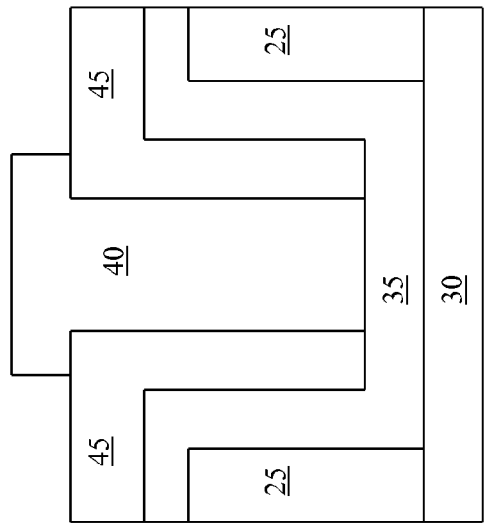

Referring to FIG. 2H, interconnect 40, hard mask 45, and liner and seed layer 35 may be planarized so as to be coplanar with a top surface of dielectric layer 25. In an embodiment, the planarization step may be performed using chemical-mechanical polishing resulting in interconnect 40 having a thickness of approximately 5 µm to approximately 20 µm and a width of approximately 5 µm to approximately 150 µm. An example of interconnect 40 is a copper inductor or a transmission line.

Figure 3:
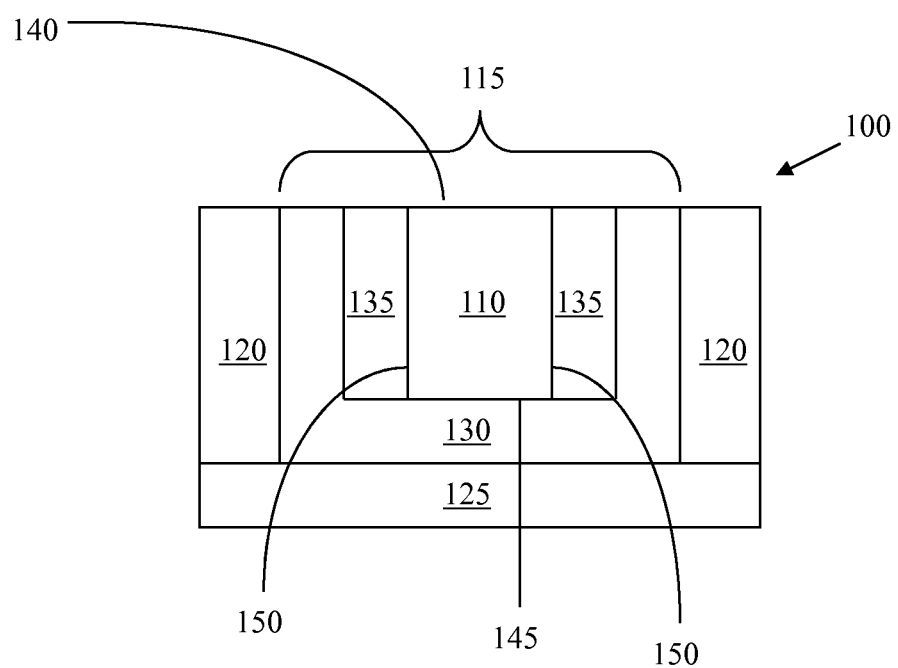
FIG. 3 depicts an embodiment of an inductor, in accordance with the present invention.

An embodiment of an inductor is presented in accordance with the present invention. Referring to FIG. 3, an inductor 100 is provided having a core conductor 110, a trench 115, a dielectric layer 120, a substrate 125, a liner and seed layer 130, and a hard mask 135.

Core conductor 110 includes a top surface 140, a bottom surface 145, and sidewalls 150 within trench 115. Core conductor 110 may comprise copper, silver, and gold, and may be approximately 5 microns (µm) to approximately 150 µm wide and approximately 5 µm to approximately 20 µm deep. Trench 115 is within dielectric layer 120 which is disposed on substrate 125. Substrate 125 may be a semiconductor substrate comprising materials and including embodiments already described herein for substrate 30.

Dielectric layer 120 may be silicon dioxide (SiO$_2$) approximately 5 µm to approximately 20 µm thick. In another example, dielectric layer 120 may be fluorinated silicon dioxide (FSG) or an organic material, for example, polyimide. Examples of materials for use as dielectric layer 120 are known in the art. Additionally, dielectric layer 120 may be a dual layer or a stack of three dielectric layers wherein adjacent layers comprise different dielectric materials.

Trench 115 may be approximately 5 µm to approximately 150 µm wide and approximately 5 µm to approximately 20 µm deep. Trench 115 may be conformally coated with liner and seed layer 130. Embodiments of liner and seed layer 130 are the same as for liner and seed layer 35 described herein for FIG. 2B.

Core conductor 110 includes hard mask 135 on sidewalls 150. Hard mask 135 may be an anti-seeding material or a dielectric material. The anti-seeding conductive material may be selected from the group consisting of TiN, W, Ta, and TaN. The dielectric material may be selected from the group consisting of silicon nitride (Si$_3$N$_4$), silicon carbide (SiC).

Figure 4B:
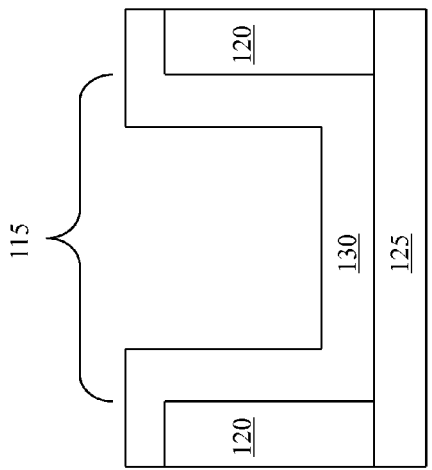
FIGS. 4A-4H depicts steps of an embodiment of a method for fabricating an inductor, in accordance with the present invention.
Figure 4D:
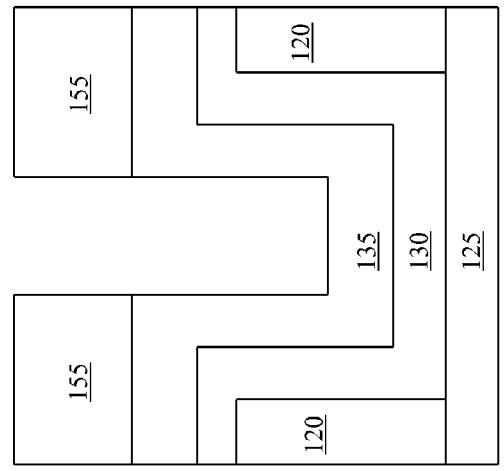
Figure 4A:
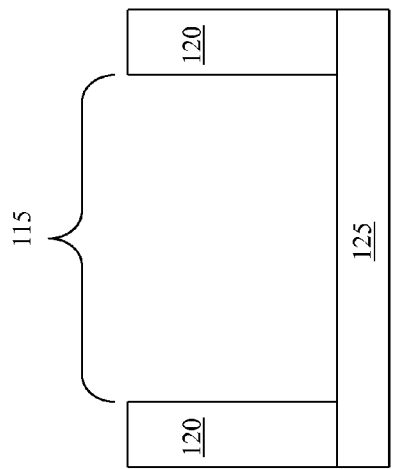

An embodiment of steps of a method of fabricating an inductor are shown in FIGS. 4A-4H. Referring to FIG. 4A, a substrate 125 comprising silicon, silicon-on-insulator, silicon germanium, or gallium arsenide is provided. Substrate 125 may include any construction comprising semiconductor material, including but not limited to bulk semi-conductive materials such as a semiconductor wafer (either alone or in assemblies comprising other materials thereon). Substrate 125 may also be a semiconductor substrate comprising materials and including embodiments already described herein for substrate 30.

Substrate 125 may already have dielectric layer 120 deposited thereon. In an embodiment, dielectric layer 120 may be silicon dioxide. Alternatively, dielectric layer 120 may be deposited on substrate 125 using any now known or later developed techniques appropriate for the material to be deposited. Examples of such techniques have been described herein in the description for FIG. 2A.

Trench 115 is etched into dielectric layer 120. This may be accomplished by applying a layer of photoresist to dielectric layer 120, performing a photolithographic process, and performing a reactive ion etch (RIE) process selective to etch, for example, silicon dioxide, to define trench 115 in dielectric layer 120.

Referring to FIG. 4B, trench 115 may be conformally coated with a liner and seed layer 130. The liner component of layer 130 deposited may be Ta approximately 100 Å to approximately 1,000 Å thick. The seed component of layer 130 may be copper metal 400 Å to approximately 2,000 Å thick. In an embodiment, the liner component may contact dielectric layer 120 and substrate 125 with the seed component overlaying the liner component. The aforementioned may be formed by PVD. Liner and seed layer 130 may conformally coat the bottom and side walls of trench 115, and top surface of dielectric layer 120.

Figure 4C:
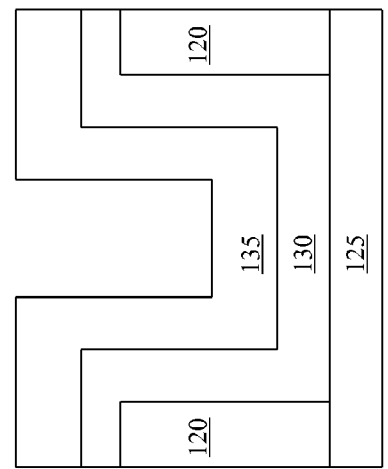

Referring to FIG. 4C, hard mask 135 may be deposited on liner and seed layer 130 via conventional CVD or PVD processes known in the art. Alternatively, hard mask 135 may be deposited using the techniques described herein for FIG. 3C. Hard mask 135 may comprise TiN and may be approximately 300 Å to approximately 1,000 Å thick throughout the entire layer. In an embodiment, hard mask 135 may be approximately 400 Å thick.

Referring to FIG. 4D, trench 115 may be masked with a photoresist layer 155 and patterned to expose the area of hard mask 135 that coats the bottom of trench 115. Photoresist layer 155 may be approximately 5 µm to approximately 50 µm thick. In one embodiment, photoresist layer 155 may be approximately 10 µm thick. Photoresist materials used for masking and patterning, and the methods for performing the same are known in the art.

Figure 4E:
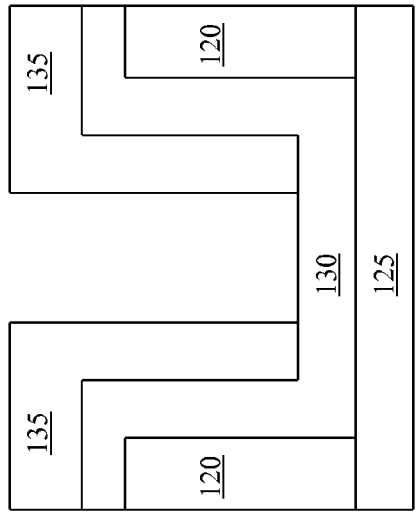

Referring to FIG. 4E, a reactive ion etch (RIE) may then be performed partially etching the area of hard mask 135 that coats the bottom of trench 115. The thickness of the partially etched area may further be etched to approximately 100 Å. The photoresist layer 155 may then subsequently stripped.

Figure 4F:
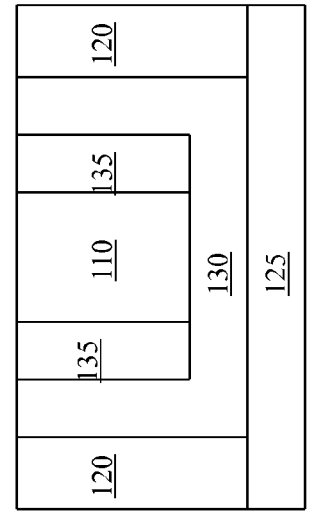

Referring to FIG. 4F, a blanket RIE may be performed etching the remaining area of hard mask 135 that coats the bottom of trench 115 and the areas of hard mask 135 coating liner and seed layer 130 on dielectric layer 120. The remaining area of hard mask 135 may be etched away exposing the copper seed component of layer 130, and the areas coating liner and seed layer 130 may then be etched to approximately 300 Å.

Figure 4G:
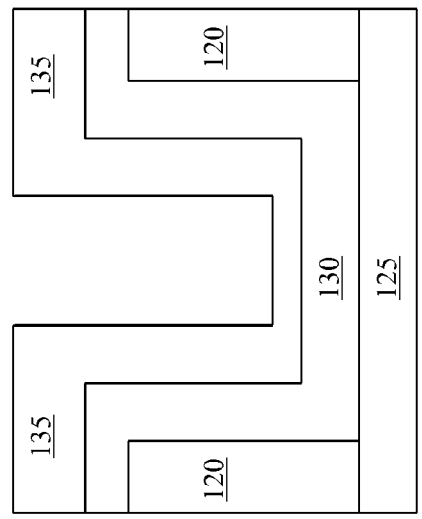

Referring to FIG. 4G, core conductor 110 may be formed from liner and seed layer 130 by performing an electrolytic metal plating process to fill trench 115. The process may be performed with a current density of approximately 1 A/cm$^2$ to approximately 15 A/cm$^2$ using a plating solution including a copper sulfate solution, a sulfuric acid solution, and a solution including chlorine ions. Core conductor 110 may be vertically grown from the exposed areas of the copper seed component of layer 130 toward and past the top of trench 115.

Figure 4H:
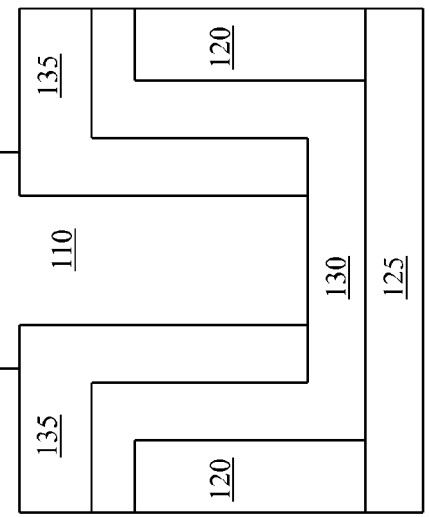

Referring to FIG. 4H, core conductor 110, hard mask 135, and liner and seed layer 130 are planarized so as to be coplanar with a top surface of dielectric layer 120 so as to form inductor 100. In an embodiment, the planarization step may be performed using chemical-mechanical polishing resulting in core conductor 110 having a thickness of approximately 5 µm to approximately 20 µm and a width of approximately 5 µm to approximately 150 µm.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced item. The modifier "approximately" used in connection with a quantity is inclusive of the stated value and has the meaning dictated by the context, (e.g., includes the degree of error associated with measurement of the particular quantity). The suffix "(s)" as used herein is intended to include both the singular and the plural of the term that it modifies, thereby including one or more of that term (e.g., the metal(s) includes one or more metals). Ranges disclosed herein are inclusive and independently combinable (e.g., ranges of "up to approximately 25 wt %, or, more specifically, approximately 5 wt % to approximately 20 wt %", is inclusive of the endpoints and all intermediate values of the ranges of "approximately 5 wt % to approximately 25 wt %," etc).

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method of fabricating an interconnect in an integrated circuit, the method comprising:
    forming a trench in a dielectric layer disposed on a substrate, the trench exposing a portion of the substrate;
    conformally coating the trench with a liner and seed layer such that a first portion of the liner and seed layer is disposed over a portion of the dielectric layer;
    conformally depositing a hard mask on the liner and seed layer within the trench and over the portion of the dielectric layer;
    masking the trench with a photoresist layer and patterning the photoresist layer to expose an area of the hard mask at a bottom of the trench;
    removing the exposed area of the hard mask from the bottom of the trench to expose a second portion of the liner and seed layer such that a first portion of the hard mask remains over the dielectric layer;
    electrolytic metal plating the exposed second portion of the liner and seed layer at the bottom of the trench to form the interconnect; and
    planarizing the interconnect, the liner and seed layer, and the hard mask to a top surface of the trench,
    wherein the removing of the exposed area of the hard mask includes:
        performing a first etch to remove a portion of the exposed area of the hard mask on the liner and seed layer at a bottom of the trench; and
        performing a second etch to remove a remaining portion of the exposed area of the hard mask on the liner and seed layer at a bottom of the trench.

2. The method of fabricating an interconnect according to claim 1, wherein the hard mask comprises a material selected from one of titanium nitride (TiN), tungsten (W), tantalum (Ta), tantalum nitride (TaN), silicon nitride ($Si_3N_4$), silicon carbide (SiC) and aluminum oxide ($Al_2O_3$).

3. The method of fabricating an interconnect according to claim 1, wherein the interconnect comprises a material selected from one of copper, silver, and gold.

4. The method of fabricating an interconnect according to claim 1, wherein the interconnect is approximately 5 microns (µm) to approximately 150 µm wide.

5. The method of fabricating an interconnect according to claim 1, wherein the planarizing includes chemical-mechanical polishing the interconnect.

6. The method of fabricating an interconnect according to claim 1, wherein the electrolytic metal plating includes plating the exposed areas of the liner and seed layer with a current density of approximately 1 A/cm$^2$ to approximately 15 A/cm$^2$ using a plating solution comprising a copper sulfate solution, a sulfuric acid solution, and a solution including chlorine ions.

7. A method of fabricating an inductor, the method comprising:
    forming a trench in a dielectric layer disposed on a substrate, the trench exposing a portion of the substrate;
    conformally coating the trench with a liner and seed layer such that a first portion of the liner and seed layer is disposed over a portion of the dielectric layer;
    conformally depositing a hard mask on the liner and seed layer within the trench and over the portion of the dielectric layer;
    masking the trench with a photoresist layer and patterning the photoresist layer to expose an area of the hard mask at a bottom of the trench;
    removing the exposed area of the hard mask from the bottom of the trench to expose a second portion of the liner and seed layer such that a first portion of the hard mask remains over the dielectric layer;
    electrolytic metal plating the exposed second portion of the liner and seed layer at the bottom of the trench to form a core conductor; and
    planarizing the core conductor, the hard mask, and the liner and seed layer to a top surface of the trench,
    wherein the removing of the exposed area of the hard mask includes:
        performing a first etch to remove a portion of the exposed area of the hard mask on the liner and seed layer at a bottom of the trench; and
        performing a second etch to remove a remaining portion of the exposed area of the hard mask on the liner and seed layer at a bottom of the trench.

8. The method of fabricating an inductor according to claim 7, wherein the hard mask comprises a material selected from one of titanium nitride (TiN), tungsten (W), tantalum (Ta), tantalum nitride (TaN), silicon nitride ($Si_3N_4$), silicon carbide (SiC), aluminum oxide ($Al_2O_3$).

9. The method of fabricating an inductor according to claim 7, wherein the core conductor comprises a material selected from one of copper, gold, and silver.

10. The method of fabricating an inductor according to claim 7, wherein the interconnect is approximately 5 microns (µm) to approximately 150 µm wide.

11. The method of fabricating an inductor according to claim 7, wherein the planarizing includes chemical-mechanical polishing the core conductor, the hard mask, and the liner and seed layer with a top surface of the trench.

12. The method of fabricating an inductor according to claim 7, wherein the electrolytic metal plating includes plating the exposed areas of the liner and seed layer with a current density of approximately 1 A/cm$^2$ to approximately 15 A/cm$^2$ using a plating solution comprising a copper sulfate solution, a sulfuric acid solution, and a solution including chlorine ions.

13. The method of fabricating an interconnect according to claim 1, wherein the performing of the first etch includes performing a reactive ion etch and the performing of the second etch includes performing a blanket reactive ion etch.

14. The method of fabricating an inductor according to claim 7, wherein the performing of the first etch includes performing a reactive ion etch and the performing of the second etch includes performing a blanket reactive ion etch.

15. A method of fabricating an interconnect in an integrated circuit, the method comprising:

forming a trench in a dielectric layer disposed on a substrate, the trench exposing a portion of the substrate;

conformally coating the trench with a liner and seed layer such that a first portion of the liner and seed layer is disposed over a portion of the dielectric layer;

conformally depositing a hard mask on the liner and seed layer within the trench and over the portion of the dielectric layer;

masking the trench with a photoresist layer and patterning the photoresist layer to expose an area of the hard mask at a bottom of the trench;

performing a first etch to remove a portion of the exposed area of the hard mask on the liner and seed layer at the bottom of the trench; and performing a second etch to remove a remaining portion of the exposed area of the hard mask at the bottom of the trench to expose a second portion of the liner and seed layer at the bottom of the trench;

electrolytic metal plating the exposed second portion of the liner and seed layer at the bottom of the trench to form the interconnect; and planarizing the interconnect, the liner and seed layer, and the hard mask to a top surface of the trench.

16. The method of fabricating an interconnect according to claim 15, wherein the hard mask comprises a material selected from the group consisting of: titanium nitride (TiN), tungsten (W), tantalum (Ta), tantalum nitride (TaN), silicon nitride ($Si_3N_4$), silicon carbide (SiC) and aluminum oxide ($Al_2O_3$).

17. The method of fabricating an interconnect according to claim 15, wherein the interconnect comprises a material selected from the group consisting of: copper, silver, and gold.

18. The method of fabricating an interconnect according to claim 15, wherein the performing of the first etch includes performing a reactive ion etch and the performing of the second etch includes performing a blanket reactive ion etch.

\* \* \* \* \*